United States Patent
Appleton, Jr. et al.

(10) Patent No.: US 11,424,356 B2
(45) Date of Patent: Aug. 23, 2022

(54) TRANSISTOR HAVING RESISTIVE FIELD PLATE

(71) Applicant: Raytheon Company, Waltham, MA (US)

(72) Inventors: Brian Thomas Appleton, Jr., Stoneham, MA (US); Casey Alan Howsare, Malden, MA (US)

(73) Assignee: Raytheon Company, Waltham, MA (US)

( * ) Notice: Subject to any disclaimer, the term of this patent is extended or adjusted under 35 U.S.C. 154(b) by 63 days.

(21) Appl. No.: 16/819,728

(22) Filed: Mar. 16, 2020

(65) Prior Publication Data

US 2021/0288170 A1   Sep. 16, 2021

(51) Int. Cl.
| | |
|---|---|
| *H01L 29/778* | (2006.01) |
| *H01L 29/20* | (2006.01) |
| *H01L 29/205* | (2006.01) |
| *H01L 29/40* | (2006.01) |

(52) U.S. Cl.
CPC ...... *H01L 29/7787* (2013.01); *H01L 29/2003* (2013.01); *H01L 29/205* (2013.01); *H01L 29/405* (2013.01)

(58) Field of Classification Search
CPC .. H01L 29/778; H01L 29/405; H01L 29/7787
See application file for complete search history.

(56) References Cited

U.S. PATENT DOCUMENTS

| | | |
|---|---|---|
| 6,100,571 A | 8/2000 | Mizuta et al. |
| 7,696,535 B2 | 4/2010 | Yang et al. |
| 9,761,675 B1 | 9/2017 | Marinella et al. |
| 10,109,713 B2 | 10/2018 | Chini et al. |
| 2008/0073670 A1 | 3/2008 | Yang et al. |
| 2015/0144957 A1 | 5/2015 | Lu et al. |
| 2015/0155358 A1* | 6/2015 | Briere ............... H01L 29/405 257/76 |

(Continued)

OTHER PUBLICATIONS

Kamins, "Polycrystalline Silicon for Integrated Circuits and Displays", Springer 1998 9781-4615-5577-3, pp. 195-203 (Year: 1998).*

(Continued)

*Primary Examiner* — Eugene Lee
(74) *Attorney, Agent, or Firm* — Daly, Crowley, Mofford & Durkee, LLP

(57) ABSTRACT

A transistor having: a semiconductor; a first electrode in contact with the semiconductor; a second electrode in contact with the semiconductor; and a control electrode, disposed between the first electrode and the second electrode, for controlling a flow of carriers in a channel in the semiconductor between the first electrode and the second electrode. A first electric field is produced in the channel in response to an electrical voltage applied between the first electrode and the second electrode. A field plate, comprising a resistive material, is disposed over the channel. A voltage source is connected across portions of the resistive field plate material for producing second electric field across such portions of the resistor, such second electric field being coupled into the channel to modify one or more peaks of the first electric field in the channel.

17 Claims, 5 Drawing Sheets

(56) References Cited

U.S. PATENT DOCUMENTS

| | | | |
|---|---|---|---|
| 2016/0149007 A1* | 5/2016 | Chou | H01L 29/402 257/339 |
| 2019/0237361 A1* | 8/2019 | Usami | H01L 23/53209 |
| 2019/0237569 A1* | 8/2019 | Sriram | H01L 29/1075 |
| 2020/0195248 A1* | 6/2020 | Yang | H01L 29/0619 |

OTHER PUBLICATIONS

Heuss, "Thermal Stability of Transition Metal Nitrides as NMOS Gate Electrodes," Dissertion North Caroliina State University,2002 (Year: 2002).*

Rongming Chu, Andrea Corrion, Mary Chen, Ray Li, Danny Wong, Daniel Zehnder, Brain Hughes, Karim Boutros, 1200-V Normally Off GaN-on-Si Field-Effect Transistors With Low Dynamic ON-Resistance, IEEE Electronic Device Letters, vol. 32, No. 5, May 2011, pp. 632-634, 3 pages.

Brian D. Tierney, Sukwon Choi, Sandeepan Dasgupta, Jeramy R. Dickerson, Shahed Reza, Robert J. Kaplar, Albert G. Baca, Matthew J. Marinella, Evaluation of a "Field Cage" for Electric Field Control in GaN-Based HEMTs That Extends the Scalability of Breakdown Into the kV Regime, IEEE Transactions on Electronic Devices, vol. 64, No. 9, Sep. 2017, pp. 3740-3747, 8 pages.

PCT International Search Report and Written Opinion dated May 6, 2021 for International Application No. PCT/US2021/013146; 14 Pages.

Taiwan Office Action with English Translation and IPO Search Report, Application No. 110102280, dated Sep. 24, 2021, 17 pages.

Response (with English Translation) to Taiwan Office Action and IPO Search Report dated Sep. 24, 2021 for Taiwan Application No. 110102280; Response filed Mar. 21, 2022; 40 Pages.

Taiwan Allowance Decision (with English Translation) dated Jun. 28, 2022 for Taiwan Application No. 110102280; 3 Pages.

* cited by examiner

TRANSISTOR HAVING RESISTIVE FIELD PLATE

TECHNICAL FIELD

This disclosure relates generally to transistors and more particularly to field plates used in such transistors.

BACKGROUND OF THE INVENTION

As is known in the art, many transistors use field plates to shape the electric field distribution within the transistor to reduce electric field peaks when high voltages are applied. For example, gallium nitride (GaN) based Field Effect Transistors (FETs), an particular GaN High Electron Mobility Transistors (HEMTs), are a breakthrough technology for Radio Frequency (RF) components and systems. Monolithic Microwave Integrated Circuits (MMICs) that are powered by GaN transistors support 2-3 times the power density compared to historic gallium arsenide (GaAs) or silicon (Si) technologies. Efforts to maximize the performance of GaN-based transistors for RF and power applications invariably seek to increase the operating voltage. To enable higher operating voltages, single or multiple field plates have been integrated into the FET. An optimized field plate structure (or structures) reduces the peak electric fields in the device, thereby extending breakdown voltage, reducing leakage currents, and improving reliability. A wide array of field plate designs has been proposed in patents and literature, including variations of field plate geometry, integration of multiple field plates, and biasing schemes (e.g., source-connected, eta gate-connected, and floating).

One such structure is shown in FIG. 1, As shown a transistor, here a Gallium Nitride (GaN) High Electron Mobility Transistor (HEMT) is shown to include: a semiconductor structure having a GaN layer on a substrate. An Aluminum Gallium Nitride (AlGaN) layer is on the GaN layer producing a two-dimensional electron gas (2DEG) channel in the GaN layer, as shown. The GaN layer serves to carry charge in the channel of the transistor. A conventional SiN dielectric passivation layer is provided, as shown. The transistor includes: a first electrode (the "source", S) in ohmic contact with the AlGaN layer of the transistor; a second electrode (the "drain", D) in ohmic contact with the AlGaN of the transistor; a control electrode (the "gate", G), disposed between the first electrode, S, and the second electrode, D, in Schottky contact with the AlGaN layer, for controlling a flow of carriers in a channel, here a 2DEG channel of the semiconductor structure between the first electrode, S, and the second electrode, D. An electric field profile is produced in the 2DEG channel in response to electrical voltages applied to the three electrodes, S, D, and G; this electric field profile having certain peak value(s). Here the HEMT includes a field plate, here an electrical conductor, disposed between a gate electrode (G) and Drain electrode (D). The field plate may be connected to the source electrode (S), in which case it is considered to be a source connected field plate (SCFP) or it may be connected to an independent voltage source.

SUMMARY OF THE INVENTION

In accordance with the present disclosure a transistor is provided comprising: a semiconductor; a first electrode in contact with the semiconductor; a second electrode in contact with the semiconductor; and a control electrode, disposed between the first electrode and the second electrode, for controlling a flow of carriers in a channel in the semiconductor between the first electrode and the second electrode. A first electric field is produced in the channel in response to an electrical voltage applied between the first electrode and the second electrode. A field plate, comprising a resistive material, is disposed over the channel. A voltage source is connected across portions of the resistive material for producing a second electric field across such portions of the resistor, such second electric field being coupled into the channel to modify the first electric field in the channel.

In one embodiment, a transistor is provided, comprising: a semiconductor structure; a source electrode in contact with the semiconductor structure; a drain electrode in contact with the semiconductor structure; and a gate electrode disposed between the source electrode and the drain electrode, for controlling a flow of carriers in a channel in the semiconductor structure between the first electrode and the second electrode. A first electric field profile is produced in the channel in response to electrical voltages applied to the source electrode, the drain electrode, and the gate electrode, the electric field profile having a peak or peak values. A field plate, comprised of a resistive material, is disposed over the channel in a region between the gate electrode and the drain electrode, the field plate being electrically connected on one end to the drain electrode, and on the other end providing a field plate control terminal for the transistor. A voltage source is electrically connected to the field plate control terminal, such voltage source producing a gradual potential drop along the field plate and coupled into the transistor channel to modify the magnitude of the electric field peak or peaks in the channel.

In one embodiment the transistor includes a dielectric layer disposed between the field plate and the channel.

In one embodiment the dielectric layer is selected to prevent DC current from passing between the field plate and the channel.

In one embodiment, the field plate material is chosen to be of sufficiently high electrical resistivity as to minimize power dissipated by the field plate.

With such an arrangement, a resistive field plate, such as a thin-film resistor, which provides a graded, such as a linearly-graded field plate potential; the magnitude of the field-plating effect can be adjusted by varying the voltage produced by the voltage source independent of bias voltages applied to the source, gate, and drain of the transistor. Thus, the field plate that is comprised of a thin-film resistor is disposed on top of a dielectric layer in the drain access region of a Gad HEMT. One end of the field plate is electrically connected to the drain terminal of the transistor. The other end, which does not overlap the gate terminal, is connected to an external voltage source that permits control of the field plate independent of bias voltages applied to the source, gate, and drain of the transistor. Thus, the transistor is a four-terminal device: gate, drain, source, and field plate with a carrier channel formed between the source and drain and under the gate. The field plate accomplishes the goal of peak electric field reduction by enforcing a linear grade of the electrostatic potential at the top of a dielectric layer upon which field plate sits. Provided that this dielectric layer is sufficiently thin, the field plate electrical potential across the resistive field plate will couple to the transistor carrier channel and reduce the peak electric field(s) in the channel. The control of the field plate independent of bias voltages applied to the source, gate, and drain of the transistor permits one to vary the field-plating effect in real time in order to suit dynamic performance requirements, operating voltages, environmental conditions, and reliability requirements.

Along its length, the resistive field plate enforces a linear potential drop at the surface of the dielectric (SiN layer). Provided the SiN layer is sufficiently thin, this linear potential drop will couple to the transistor channel (2DEG) and permit a gradual drop in potential between the drain and gate terminals. The external voltage source $V_{fp}$ can be adjusted to vary the field-plating effect: from negligible effect (~0V) to substantial effect ($\geq V_d$); where $V_d$ is the drain voltage; the voltage applied to the drain during normal operation, as for example, in a common or ground source application.

The resistive field plate presents a large resistance (low conductance) between its two ends, so that only a small current (1 mA or less) flows through the external voltage source.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

Like reference symbols in the various drawings indicate like elements.

DETAILED DESCRIPTION

Figure 2:
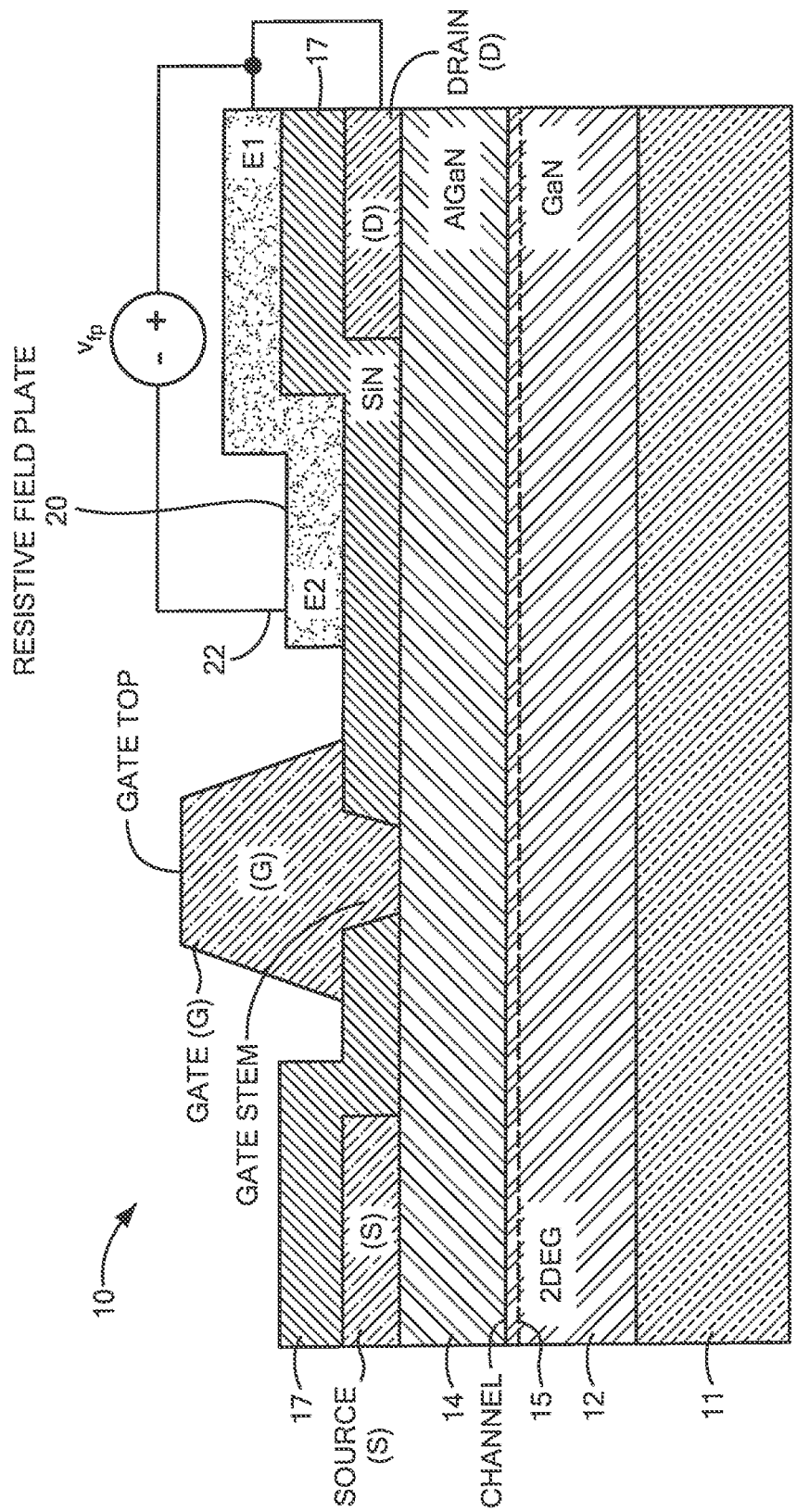
FIG. 2 is a diagrammatical, cross-sectional sketch of a transistor having resistive field plate according to the disclosure.

Referring now to FIG. 2, a transistor 10, here a Gallium Nitride High Electron Mobility Transistor (GaN HEMT) is shown to include: a semiconductor structure having a GaN layer 12, disposed on a substrate 11, with an AlGaN layer 14 disposed on the GaN layer 12 thereon producing a two-dimensional electron gas (2DEG) channel 15 in the GaN layer 12, as shown. The GaN layer 12 serves to carry charge in the channel of the transistor 10. A conventional SiN dielectric passivation layer 17 is provided, as shown. The transistor 10 includes: a first electrode (the "source", S) in ohmic contact with the 2DEG channel 15 of the transistor 10; a second electrode (the "drain", D) in ohmic contact with the 2DEG channel 15 of the transistor; a control electrode (the "gate", G), disposed between the first electrode, S, and the second electrode, D, in Schottky contact with the AlGaN layer 14, for controlling a flow of carriers in a channel, here a 2DEG channel 15 of the semiconductor structure between the first electrode, S, and the second electrode, D. An electric field profile is produced in the 2DEG channel 15 in response to electrical voltages applied to the three electrodes, S, D, and G; this electric field profile having certain peak value(s). A field plate 20, comprised of a resistive material, here for example, reactively sputtered tantalum nitride (TaN), is disposed on the dielectric passivation layer 17 over the 2DEG channel 15 in a region between the control electrode, G, and the second electrode, D. The field plate 20 is electrically connected on one end, E1, to the second electrode, D, and on the other end, E2, providing a fourth terminal 22 of the transistor 10. A voltage source, $V_{fp}$, is electrically connected to the fourth terminal 22. The voltage source value, $V_{fp}$, is set such that a gradual potential drop occurs along the field plate 20 and is coupled into the transistor 10 2DEG channel 15, such coupling providing a reduction of the magnitude of the electric field peak(s) in the 2DEG channel 15. It is noted that the voltage source $V_{fp}$ is independent of bias voltages applied to the source, gate, and drain of the transistor. The SiN layer 17 should be sufficiently thin so that this linear potential drop across the resistive field plate 20 will couple to the transistor 10 2DEG channel 15 while preventing DC current from passing between the field plate 20 and the channel 15.

More particularly, the potential drop along the length of the resistive field plate 20 is coupled into the 2DEG channel 15 by virtue of its proximity to the 2DEG channel 15. The thickness of the dielectric layer 17 (here the SiN layer between the field plate 20 and the transistor 2DEG channel 15) determines the threshold voltage associated with the field plate 20 as well as its capacitance. A field plate 20 that is closer to the channel 15 will have a stronger effect on the 2DEG channel's potential (and higher capacitance), whereas a field plate 20 that is farther away from the 2DEG channel 15 will have a weaker effect on the 2DEG channel's potential (and smaller capacitance). This is analogous to the gate G of the transistor: the closer the gate G is to the channel 15, the larger its capacitance, and the better its ability to modulate the potential in the channel 15 and the flow of carriers in the channel 15. The potential along the field plate 20 becomes coupled into the channel 15 because the laws of electrostatics require continuity in the electrostatic potential (voltage) between the field plate 20 and the silicon nitride dielectric layer 17, and likewise between the silicon nitride layer 17 and the AlGaN layer 14, the AlGaN layer 14 and the GaN channel 15. The potential on the field plate 20 is first coupled to the silicon nitride layer 17, and then to the AlGaN layer 14, and then to the 2DEG GaN channel 15. The strength of this coupling depends on the dielectric constant of the dielectric layer 17 and the thickness of the dielectric layer 17. It is noted that the side of the field plate 20 that is closest to the drain electrode D is connected to the drain electrode D. On one side, end E1 the voltage on the field plate 20 is the same as the drain electrode D voltage $V_d$ of the transistor 10. The voltage on the other side of the field plate 20 (end E2) (the side that is closer to the gate) is set via an external voltage source $V_{fp}$. In order for the field plate 20 to have an effect on the 2DEG channel 15 potential (and the desired reduction of peak electric fields around the gate, G), the external voltage source $V_{fp}$, needs to be set to a voltage that is lower than, less positive than, the drain voltage, $V_d$; for substantial peak field reduction, the external voltage source $V_{fp}$ should have a voltage similar to or lower than the gate electrode G voltage, so that the potential applied across the field plate 20 is approximately on the order of the quiescent drain-to-gate voltage. Without any field plate, the majority of the drain-to-gate voltage is dropped right at the edge of the gate, G, leading to a large peak electric field in the channel 15 near that location. With the resistive field plate 20, the drain-to-gate voltage is dropped in a distributed fashion over the entire gate-to-drain region. By definition, a potential drop over a larger distance corresponds to a smaller electric field than a potential drop over a small distance. The easiest way to experimentally set the field plate voltage is to determine the optimum voltage, based on one or more performance criteria, and "set and forget". It is acknowledged that the field plate voltage $V_{fp}$ will likely have some impact on transistor performance (for instance: on-resistance, maximum current) and there will likely be a tradeoff to make between peak electric field reduction and transistor performance. More particularly, the voltage applied to the field plate 20 is, here for example, determined on one end by the drain voltage $V_d$ and on the other end by the voltage applied via the source $V_{fp}$. The resistivity (resistance) and voltage applied both determine the amount of current flows through the resistor field plate 20. Too much current flow through the resistor is undesirable because it is wasted energy that is dissipated as heat. The field plate 20 resistance establishes an electric potential profile and an electric field that is coupled into the silicon nitride dielectric layer 17 and, in turn, into the 2DEG channel 15. Thus, the use of a resistive material enables it to produce a voltage drop across it so that the electric field produced by the voltage drop couples into the 2DEG channel 15. A linear potential drop (the slope of this potential drop being the electric field) is desirable in the transistor 2DEG channel 15 between the gate G and drain D of the transistor 10 because a linear profile minimizes the electric field peaks at the edge of the gate G.

Figure 3:
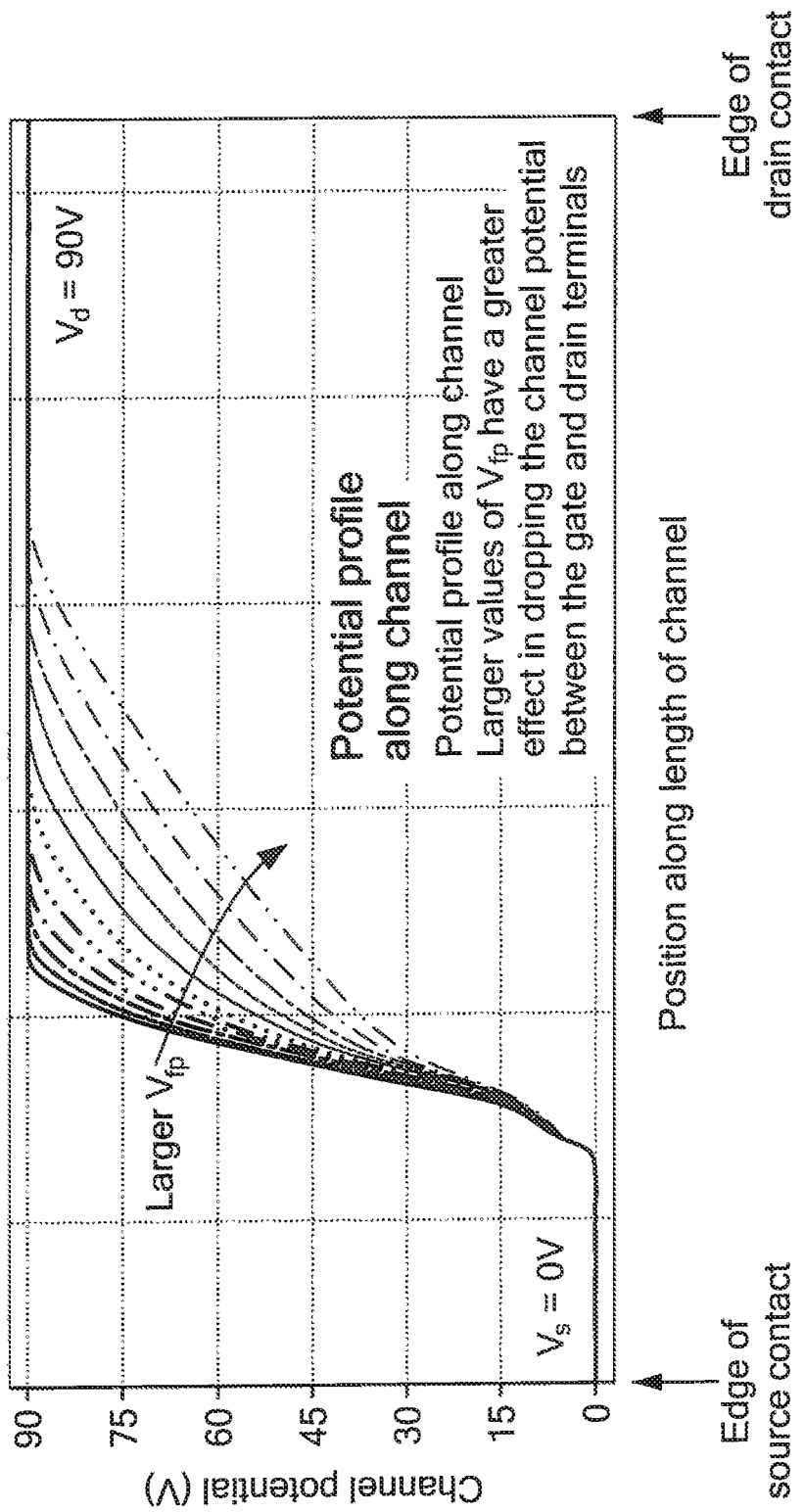
FIG. 3 shows simulation results for the electrostatic potential along the length of the 2DEG channel of a High Voltage (HV)-GaN transistor, for different values of $V_{fp}$, for the embodiment of FIG. 2.
Figure 4:
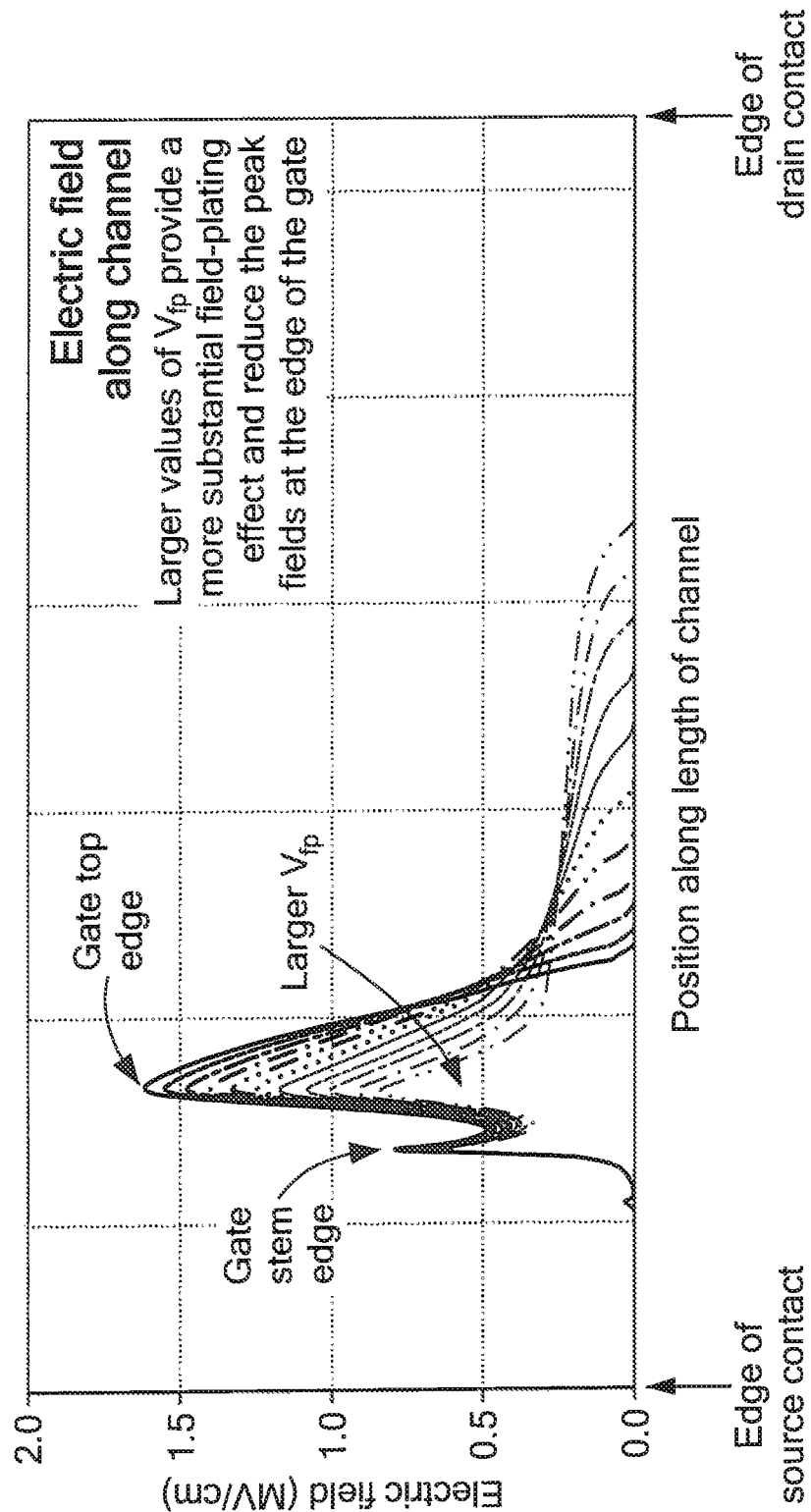
FIG. 4 shows simulation results for the electric field along the length of the 2DEG Channel of a HV-GaN transistor, for different values of $V_{fp}$, for the embodiment of FIG. 2.

FIG. 3 shows simulation results for the electrostatic potential in a High Voltage (HV)-GaN transistor 10 with one embodiment of the resistive field plate 20. The device is biased in the class AB regime (Drain voltage $V_d$=90V; Source voltage $V_s$=0V; Drain current $I_d$=90 mA/mm) and the field plate voltage ($V_{fp}$) is swept from 0V (minimum effect) to 90V (substantial effect). FIG. 4 is a plot that presents these same simulation results in a slightly different way. For a slice along the length of the transistor 2DEG channel 15, the plot in FIG. 3 shows the potential and the plot in FIG. 4 shows the electric field profile. These results establish the utility of this disclosure as a field plate as well as its ability to dynamically manipulate the potential profile in the channel by varying $V_{fp}$.

Figure 1:
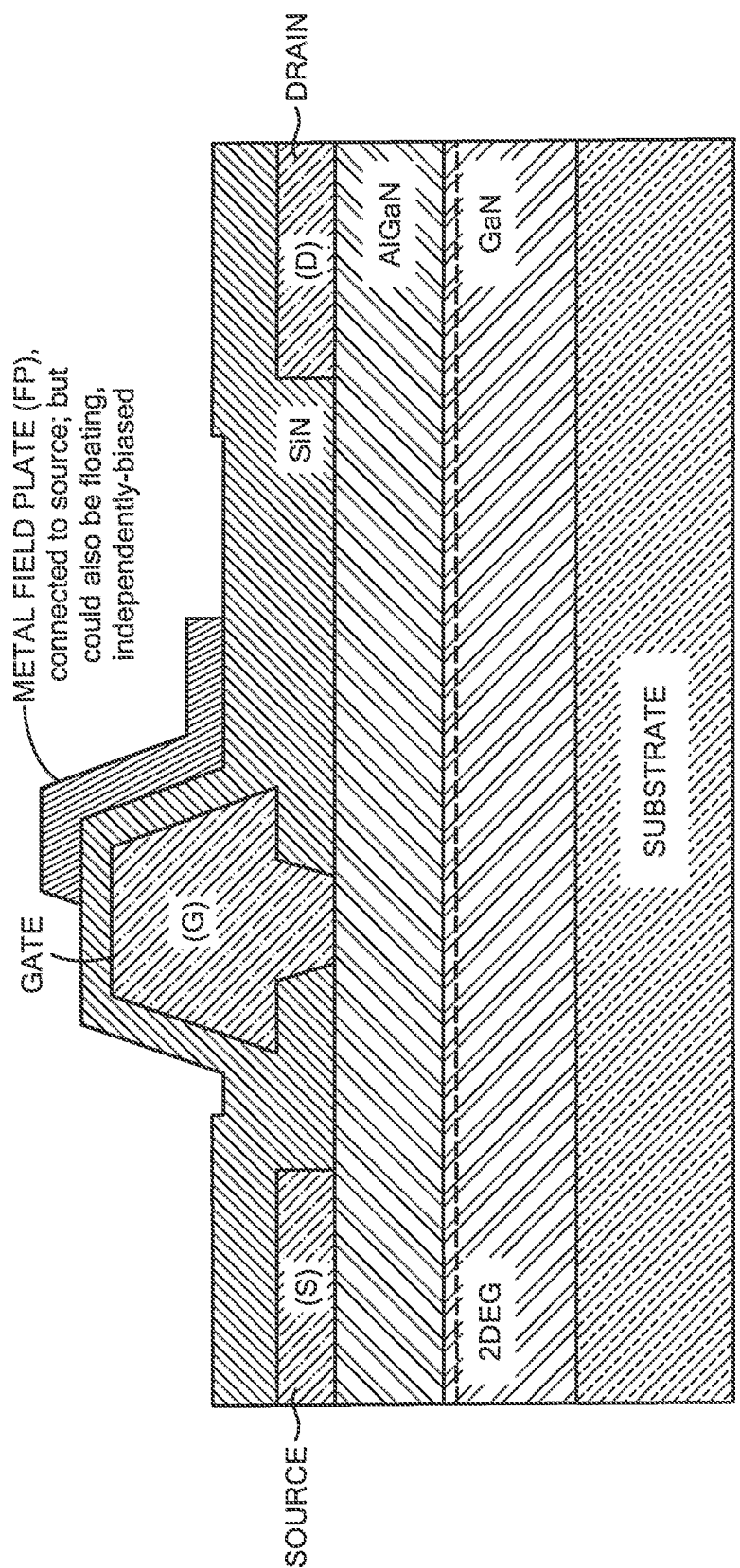
FIG. 1 is a diagrammatical, cross-sectional sketch of a transistor having electrically conductive field plate according to the PRIOR ART.
Figure 5:
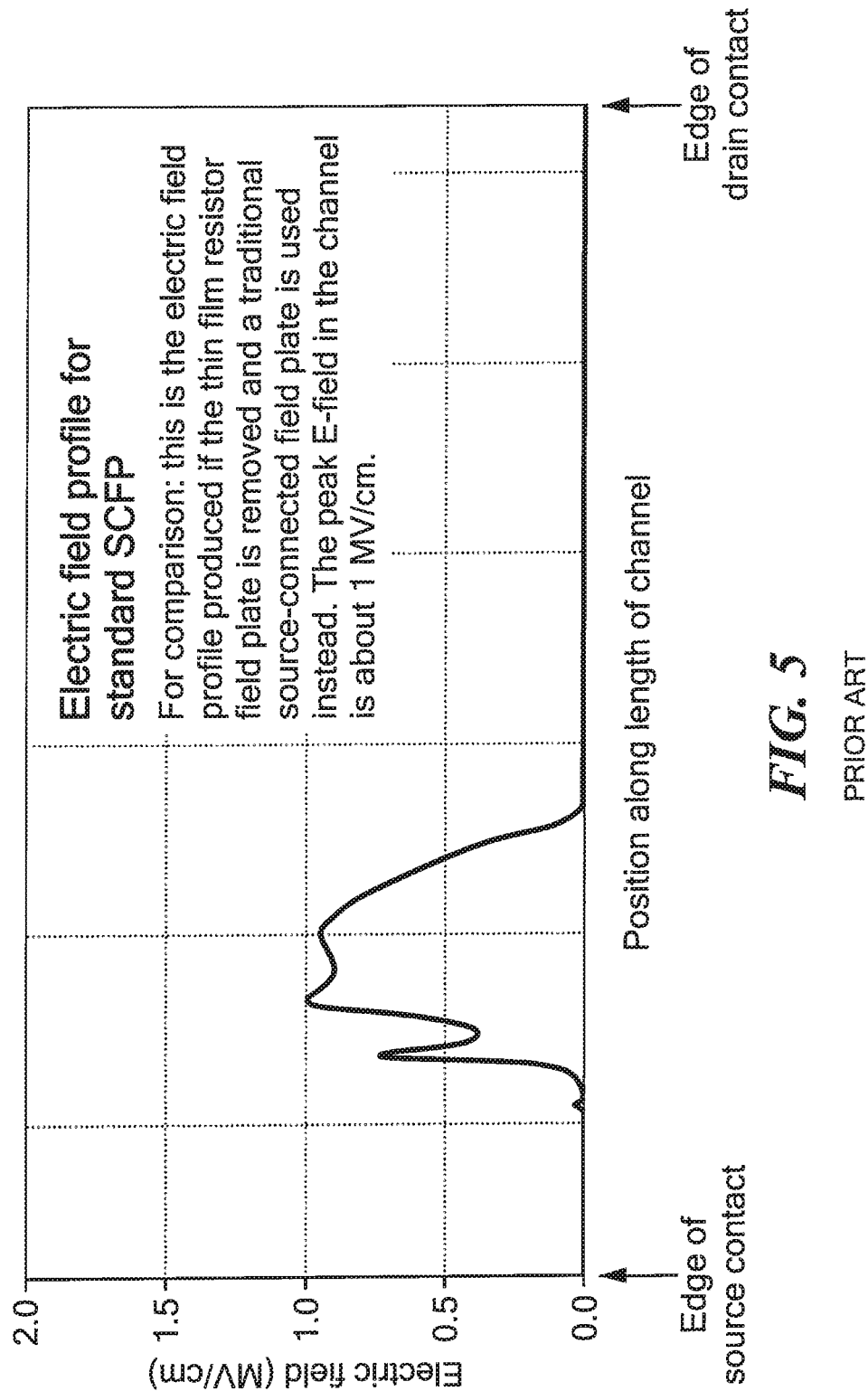
FIG. 5 shows simulation results for the electric field along the length of the 2DEG channel for the device of FIG. 1 produced by a traditional metal field plate connected in a source connected field plate (SCFP) configuration.

FIG. 5 now shows, holding bias conditions and geometry otherwise constant, the electric field profile produced by a traditional metal Source Connected Field Plate (SCFP), such as the SCFP shown in FIG. 1, i.e. the thin-film resistor field plate 20 is not present. The peak E-field is limited to about 1 MV/cm by the traditional SCFP where, in examining the results in FIG. 4, for the resistive field plate 20, it can be seen that for sufficiently large values of $V_{fp}$, the peak electric fields around the gate are similar to or smaller than those enabled by the traditional metal SUP. FIG. 5 results are intended to be compared with FIG. 4. The transistor geometry and bias conditions simulated are identical, except that the device of FIG. 5 has a traditional SCFP instead of a resistive field plate as shown in FIG. 2. It should be understood that channel position is a lateral position along the length of the channel, between the edges of the source and drain contact. The value itself is somewhat arbitrary because a channel position of zero could be defined anywhere—at the source, at the drain, in the middle of the channel, etc.; what matters is the relative positioning of things, in FIGS. 3, 4 and 5 the left limit of the plot corresponds to the channel position at the edge of the source; the right limit of the plot corresponds to the channel position at the edge of the drain.

These simulation results reveal the dynamic ability of this disclosure to control the peak fields and potential drop in the transistor. The disclosure can be used to modify (via an external voltage control, $V_{fp}$) the electrostatics of the transistor in real time to suit particular environments, operating conditions (including varying drain voltages), and performance requirements.

Two Examples:

(I) Peak Channel Temperature ($T_{ch}$) reduction: It should be understood that the field plate voltage $V_{fp}$ can be varied over time to redistribute the electric field along the 2DEG channel (FIG. 4). Because the power dissipation profile in the device is, to first order, this E-field profile multiplied by the channel current density (A/mm), the profile of power dissipation along the channel can also be manipulated by $V_{fp}$. Smaller $V_{fp}$ values would lead to a concentrated peak of power dissipation near the gate, but larger $V_{fp}$ values would better distribute the power dissipation and reduce the peak channel temperature $T_{ch}$. For instance, a transistor, designed to sustain a certain peak channel temperature in an ambient environment with a certain nominal temperature range, may be temporarily subjected to an ambient environment with an elevated temperature, thus increasing the transistor peak channel temperature beyond desired limits; by varying the field plate voltage $V_{fp}$, the peak channel temperature could be reduced, possibly at the cost of optimum performance. In order to implement such a capability, a system could be equipped with a temperature sensor whose output is coupled with analog or digital control logic that in turn can control $V_{fp}$ based on the reading from the temperature sensor, for instance by using a variable voltage regulator that produces the $V_{fp}$ voltage.

(II) E-field reduction in high-temperature environments: Reliability, which is dependent on both peak E-field(s) and temperature, is often de-rated at high temperatures. In high-temperature conditions, this disclosure thereby enables one to dynamically reduce (by increasing $V_{fp}$) the peak E-field(s) in order to mitigate device degradation and aging effects. For instance, a transistor, designed to sustain a certain peak channel temperature coupled with certain peak E-field value(s) in an ambient environment with a certain nominal temperature range, may be temporarily subjected to an ambient environment with an elevated temperature, thus increasing the transistor peak channel temperature, and coupled with the peak E-field value(s) would be detrimental to reliability and/or survivability; by varying the field plate voltage $V_{fp}$, the peak E-fields could be further reduced, possibly at the cost of optimum performance, in order to sustain reliability and survivability. In order to implement such a capability, a system could be equipped with a temperature sensor whose output is coupled with analog or digital control logic that in turn can control $V_{fp}$ based on the reading from the temperature sensor, for instance by using a variable voltage regulator that produces the $V_{fp}$ voltage. Such a capability would require a-priori establishment of a reliability model for the transistor that includes as dependent variables the peak E-fields and temperature. Such a reliability model could be used to predict quantitatively the combinations of is-field and temperature that are compatible with sufficient device reliability. Thus, it should be understood that the voltage $V_{fp}$ may be varied in real time to modify the electric fields and channel temperature in the transistor and thereby permits one to vary the field-plating effect in real time in order to suit dynamic performance requirements, operating voltages, environmental conditions, and reliability requirements by sensing these environmental conditions, as, for example by a use of a temperature sensor and feeding the temperature sensor output to the $V_{fp}$ voltage source to thereby change $V_{fp}$ accordingly or by using a microprocessor programmed to store aging effect information and produce an appropriate control signal to the $V_{fp}$ voltage source to thereby change $V_{fp}$ accordingly. In such applications it should be understood that the $V_{fp}$ voltage source would be a variable voltage source instead of a fixed voltage source.

The length of the resistive field plate material (along the length of the channel) is selected to optimize the electric field profile in the channel. The width of the resistive field plate would span the entire width of the 2DEG channel. The length and width of the resistor of the field plate 20 play a part in determining its resistance, and these parameters are fixed based on the preceding considerations. The remaining free parameters that can determine the resistance of the resistor of the field plate 20 are the resistivity of the resistor material and its thickness. Both a high resistivity and a thin thickness would increase the overall resistance. The overall resistance R of the resistive field plate, between points E1 and E2, should be chosen so that the power dissipation in the resistor (equal to $V_{fp}^2/R$) is negligible relative to the quiescent power dissipated in the transistor channel itself. For instance, a high-voltage GaN transistor might use a drain voltage of 100V and apply 0V through the voltage source $V_{fp}$ to the field plate 20, leaving $V_{fp}$=100V. A resistance R of 100 kOhm would lead to power dissipation in the resistor of 100 mW, which is a reasonable upper limit for allowable dissipated power relative to the quiescent power dissipated in the channel 15 of a transistor biased in the class AB regime. Higher resistance values would waste less power but achieving a very high resistance may be limited by practical constraints such as providing material with a high resistivity or creating very thin layers.

The thickness of the SiN dielectric should be in the range of 500-5000Å. Making it too thick will decrease the effectiveness of the field plate 20 (its ability to reduce peak fields) but making it too thin could add excessive capacitive loading or lead to excessive E-fields across the dielectric layer 17 itself, leading to premature breakdown of the SiN dielectric and/or the AlGaN layer. The dielectric material of layer 17 itself does not need to be silicon nitride (SiN). The material properties of the specific dielectric selected (e.g., dielectric constant and breakdown voltage) play a role in determining optimum thickness of the dielectric. The value of voltage across resistor should, to first order, be made about the same as the drain-to-gate or drain-to-source voltage of the transistor.

A number of embodiments of the disclosure have been described. Nevertheless, it will be understood that various modifications may be made without departing from the spirit and scope of the disclosure. For example, the voltage applied to the resistive field plate 20 may be constant or a system could be given the ability to adjust the field plate voltage $V_{fp}$ based on real-time performance requirements. Further, the resistivity or the thickness of the resistive field plate 20 may be designed to vary over the length of the field plate 20. Still further, the gate need not be in Schottky contact, and a Metal-Insulator-Semiconductor (MIS) gate may be used with the resistive field plate. Accordingly, other embodiments are within the scope of the following claims.

What is claimed is:

1. A transistor, comprising:
   a semiconductor structure;
   a first electrode in direct contact with the semiconductor structure;
   a second electrode in direct contact with the semiconductor structure;
   a control electrode, disposed between the first electrode and the second electrode, configured to control a flow of carriers in a channel in the semiconductor structure between the first electrode and the second electrode, wherein a first electric field is produced in the channel in response to an electrical voltage applied between the first electrode and the second electrode;
   a field plate, comprising a resistive material, disposed over the channel, wherein the field plate is not in direct contact with the control electrode; and
   a voltage source connected across portions of the resistive material configured to generate a second electric field across such portions of the resistive material, the second electric field being coupled into the channel to modify the first electric field in the channel,
   wherein a first terminal of the voltage source is directly connected to a first end of the field plate and the second electrode,
   wherein a second terminal of the voltage source is directly connected to a second end of the field plate.

2. The transistor recited in claim 1 including a dielectric layer disposed between the field plate and the channel.

3. The transistor recited in claim 2 wherein the dielectric layer is selected to prevent DC current from passing between the field plate and the channel.

4. The transistor recited in claim 3 wherein the field plate material is chosen to be of sufficiently high electrical resistance as to minimize power dissipated by the field plate.

5. A transistor, comprising:
   a first semiconductor;
   a second semiconductor being in contact with the first semiconductor;
   a dielectric layer in direct contact with the second semiconductor;
   a source electrode in direct contact with the second semiconductor;
   a drain electrode in direct contact with the second semiconductor;
   a gate electrode disposed between the source electrode and the drain electrode, configured to control a flow of carriers in a channel in the first semiconductor structure between the source electrode and the drain electrode, wherein an electric field profile is produced in the channel in response to electrical voltages applied to the source electrode, the drain electrode and the gate electrode, the electric field profile having one or more peak values;
   a field plate, comprised of a resistive material, disposed over the channel in a region between the gate electrode and the drain electrode, the field plate being electrically connected on one end to the drain electrode, and on the other end configured to provide a field plate control terminal for the transistor, wherein the field plate is in direct contact with the dielectric layer and is not in direct contact with either the drain electrode or the gate electrode; and
   a voltage source electrically connected to the field plate, such voltage source configured to generate a voltage to produce a gradually changing potential drop along the field plate and coupled into the transistor channel to modify the magnitude of one or more electric field peaks in the channel,
   wherein a first terminal of the voltage source is directly connected to a first end of the field plate and the drain electrode,
   wherein a second terminal of the voltage source is directly connected to a second end of the field plate.

6. The transistor recited in claim 5 wherein the dielectric layer is selected to prevent DC current from passing between the field plate and the channel.

7. The transistor recited in claim 6 wherein the field plate material is chosen to be of sufficiently high electrical resistivity as to minimize power dissipated by the field plate.

8. The transistor recited in claim 1 wherein the voltage source produces the voltage as a time varying voltage.

9. The transistor recited in claim 5 wherein the voltage source produces the voltage as a time varying voltage.

10. The transistor recited in claim 5 wherein the second end of the field plate is closer to the gate electrode than the first end of the field plate.

11. The transistor recited in claim 5 wherein the first semiconductor is gallium nitride.

12. The transistor recited in claim 11 wherein the second semiconductor is aluminum gallium nitride.

13. The transistor recited in claim 12 wherein the dielectric layer is silicon nitride.

14. The transistor recited in claim 13 wherein the channel comprises two-dimensional electron gas.

15. The transistor recited in claim 1 wherein the second end of the field plate is closer to the gate electrode than the first end of the field plate.

16. The transistor recited in claim 1 wherein the semiconductor structure comprises:
 a first semiconductor; and
 a second semiconductor directly on the first semiconductor,
 wherein the channel is in the first semiconductor.

17. The transistor recited in claim 1 wherein the field plate is not in direct contact with either the first electrode or the second electrode.

* * * * *